(12) United States Patent
Copeland et al.

(10) Patent No.: US 12,218,447 B2
(45) Date of Patent: Feb. 4, 2025

(54) DATA PROCESSOR CARTRIDGE

(71) Applicant: AMULET HOTKEY LTD, Newton Abbot (GB)

(72) Inventors: Sean Andrew Copeland, Toronto (CA); Mark Lawrence Stevens, Newton Abbot (GB)

(73) Assignee: AMULET HOTKEY LTD, Devon (GB)

( * ) Notice: Subject to any disclaimer, the term of this patent is extended or adjusted under 35 U.S.C. 154(b) by 271 days.

(21) Appl. No.: 17/545,796

(22) Filed: Dec. 8, 2021

(65) Prior Publication Data
US 2023/0056377 A1 Feb. 23, 2023

(30) Foreign Application Priority Data
Aug. 20, 2021 (GB) .................................... 2111982

(51) Int. Cl.
| | |
|---|---|
| H01R 12/72 | (2011.01) |
| G02B 6/42 | (2006.01) |
| G06F 1/18 | (2006.01) |
| G06F 1/20 | (2006.01) |
| H01R 12/73 | (2011.01) |
| H05K 1/02 | (2006.01) |

(52) U.S. Cl.
CPC ......... *H01R 12/721* (2013.01); *G02B 6/4269* (2013.01); *G06F 1/181* (2013.01); *G06F 1/20* (2013.01); *H01R 12/737* (2013.01); *G06F 2200/201* (2013.01); *H05K 1/0201* (2013.01); *H05K 1/0209* (2013.01)

(58) Field of Classification Search
CPC .................................................... H01R 12/721
See application file for complete search history.

(56) References Cited

U.S. PATENT DOCUMENTS

| | | | |
|---|---|---|---|
| 4,089,464 A * | 5/1978 | Teti, Jr. ..................... | H02B 1/04 294/142 |
| 2004/0004822 A1 | 1/2004 | Ruckerbauer et al. | |
| 2004/0160745 A1* | 8/2004 | Aizawa ................... | G06F 1/185 361/748 |
| 2006/0109636 A1 | 5/2006 | Hood, III et al. | |
| 2009/0303681 A1 | 12/2009 | Tian et al. | |
| 2015/0138735 A1 | 5/2015 | Oh et al. | |
| 2017/0286353 A1* | 10/2017 | Tamarkin ............ | G06F 13/4282 |

OTHER PUBLICATIONS

"United Kingdom Intellectual Property Office Search Report" received in United Kingdom Patent Application No. GB2111982.1 for Amulet Hotkey Ltd, dated Jan. 27, 2022 (3 pages).

\* cited by examiner

*Primary Examiner* — James Harvey
(74) *Attorney, Agent, or Firm* — Tillman, Wright & Wolgin; James D. Wright; David R. Higgins

(57) ABSTRACT

A data processor cartridge comprising a housing to accommodate two data processor assemblies, and further comprising: a first connector (2A) to receive a first data processor assembly (10); and a second connector (2B) to receive a second data processor assembly (11); and wherein the second connector (2B) is arranged to receive the second data processor in an inverted orientation as compared to the orientation in which the first connector receives the first data processor assembly.

18 Claims, 15 Drawing Sheets

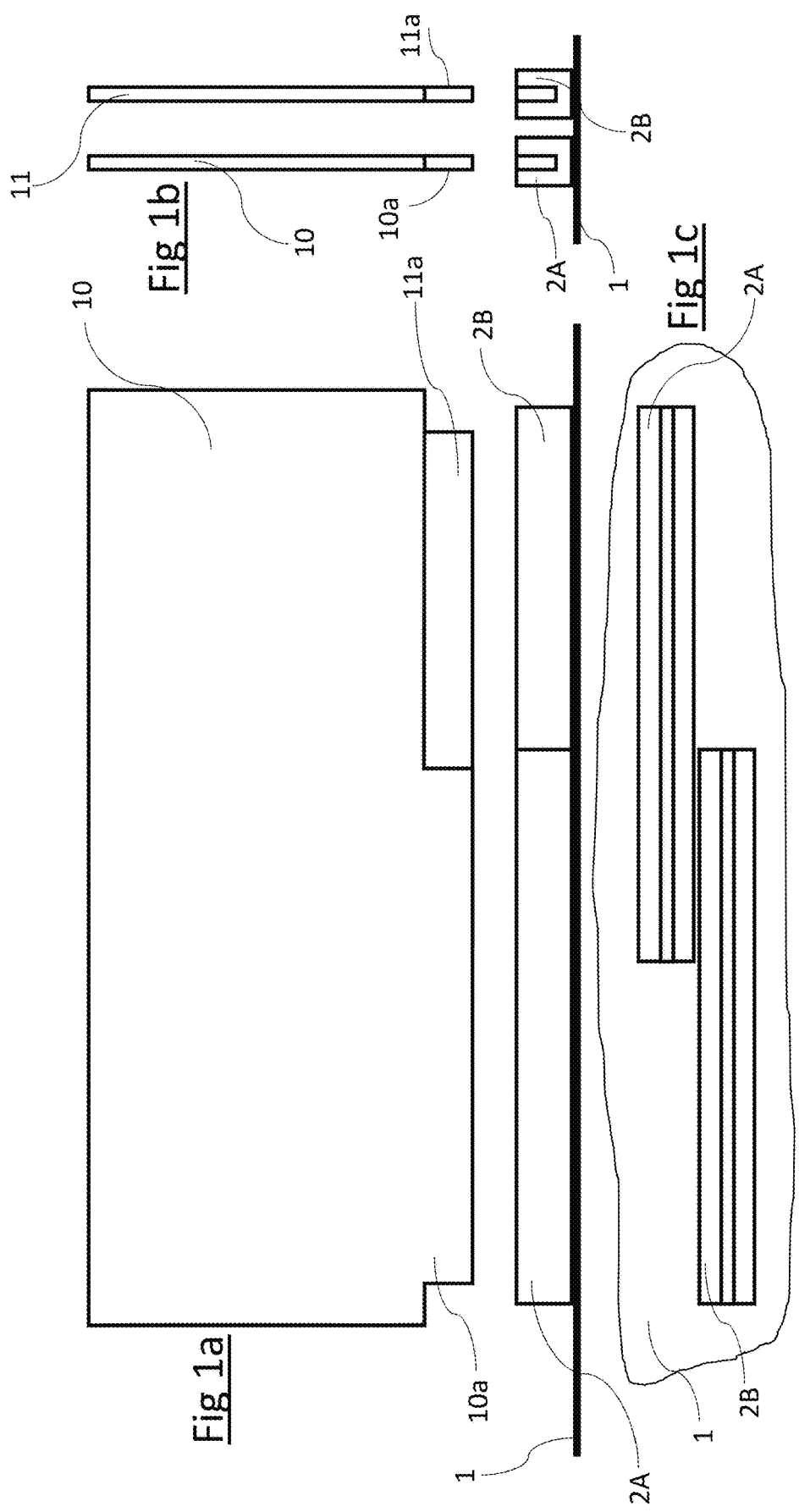

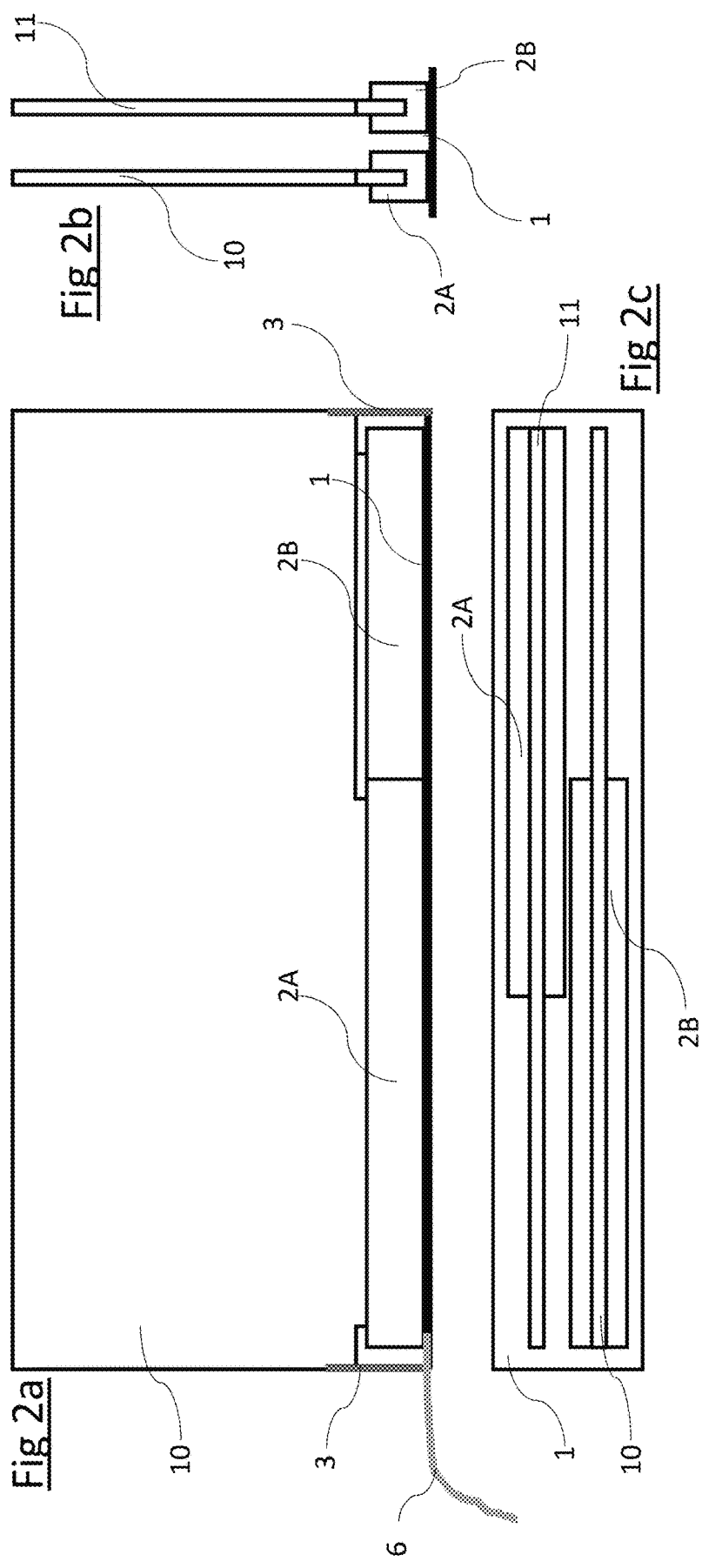

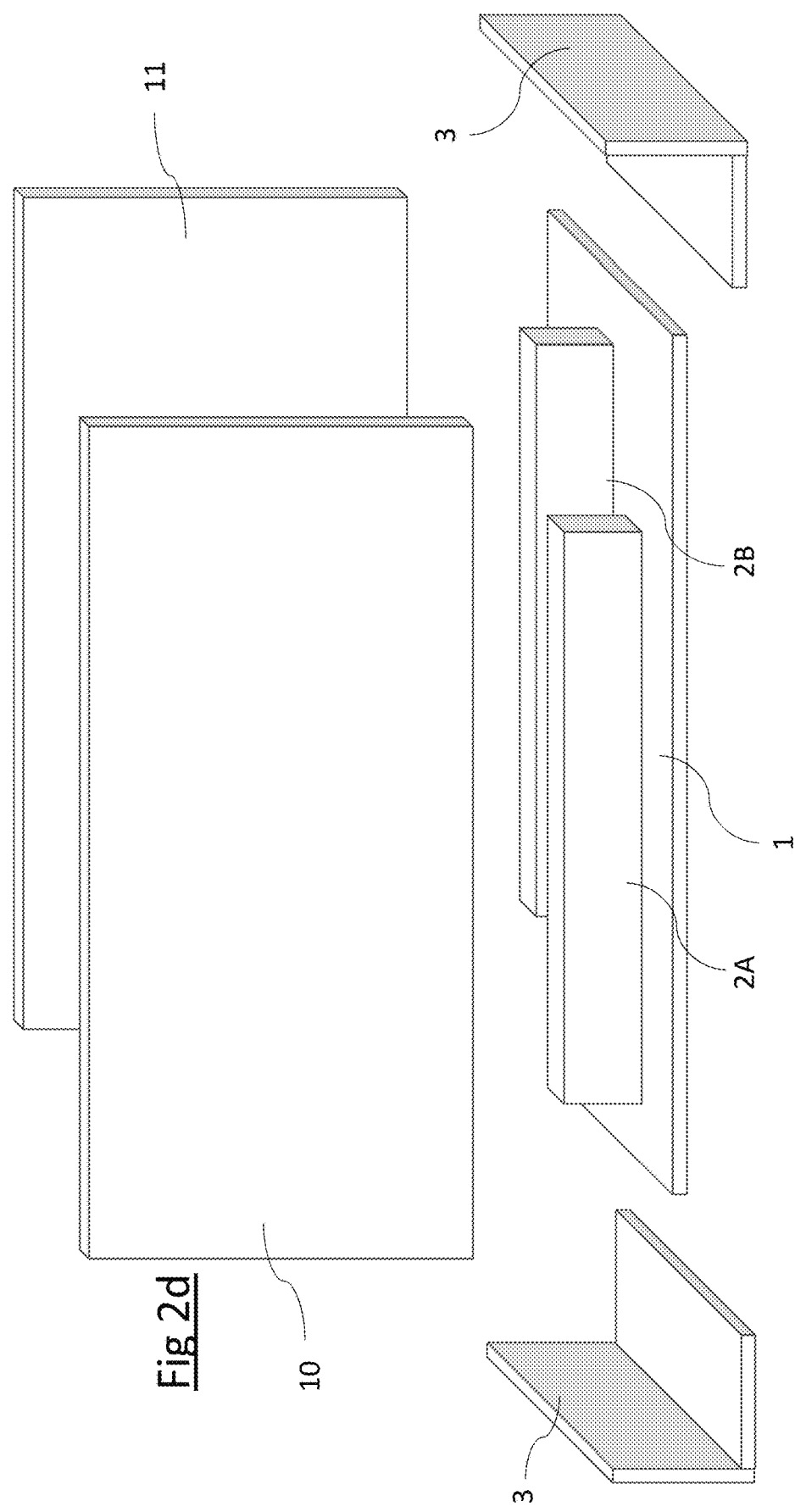

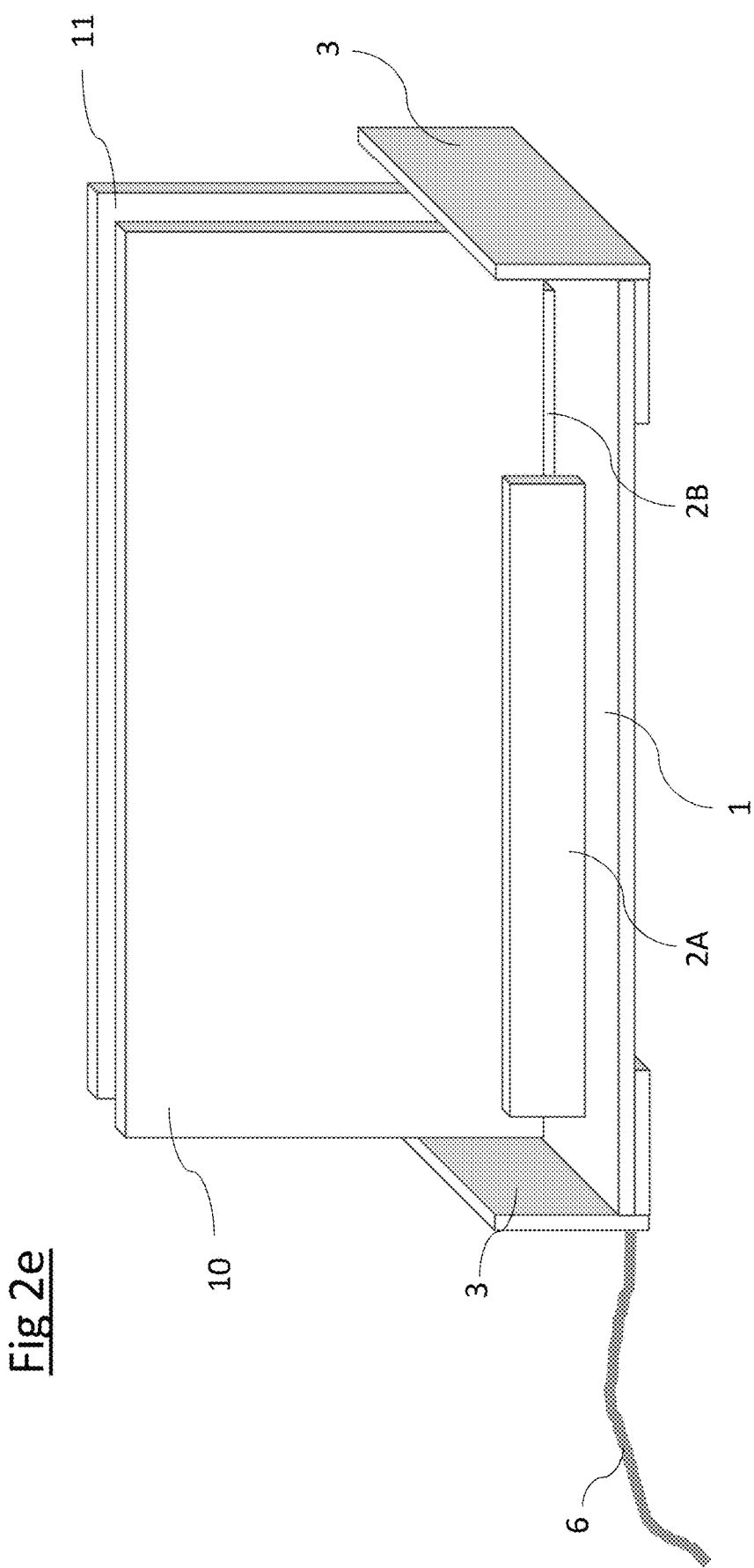

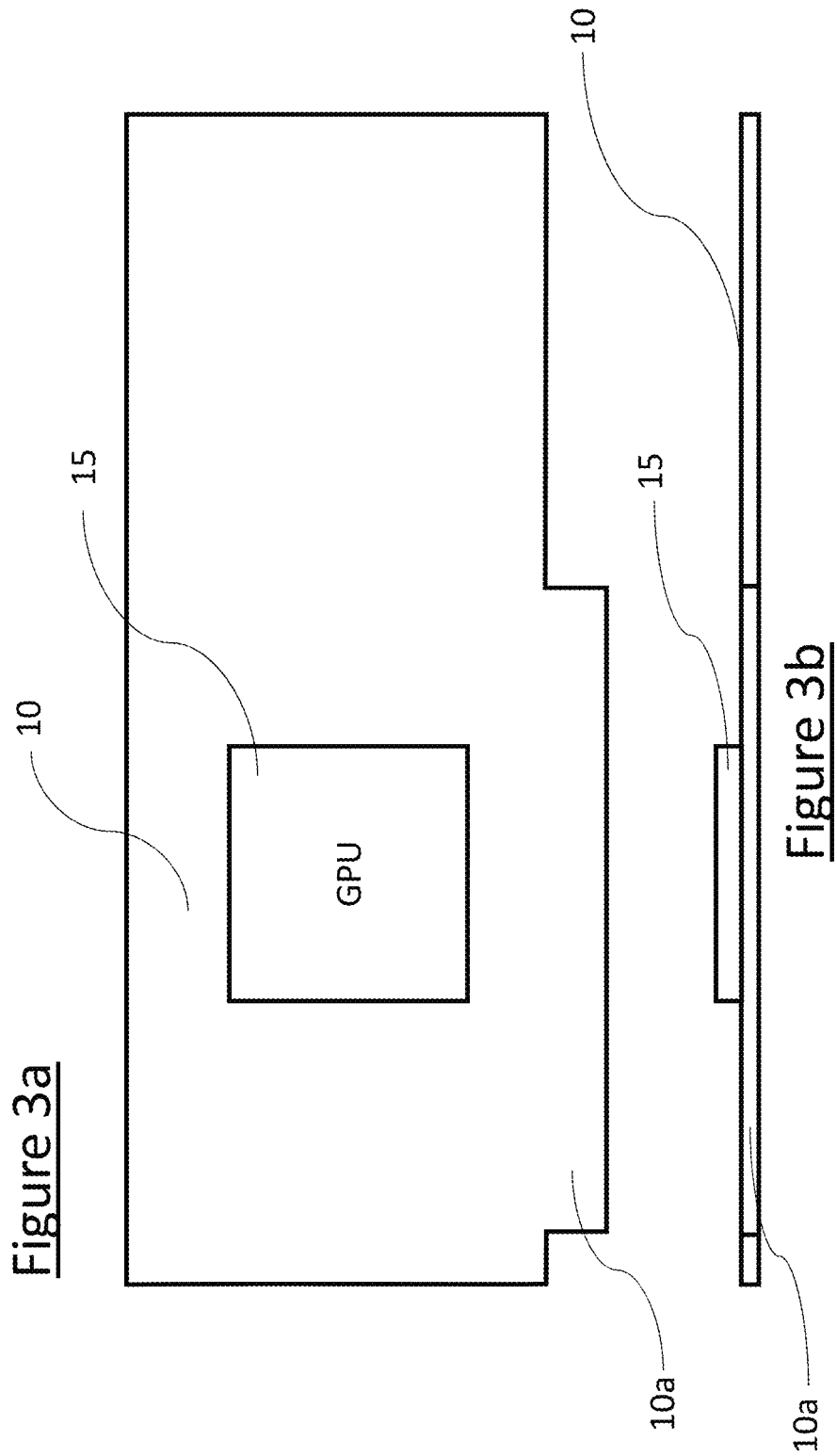

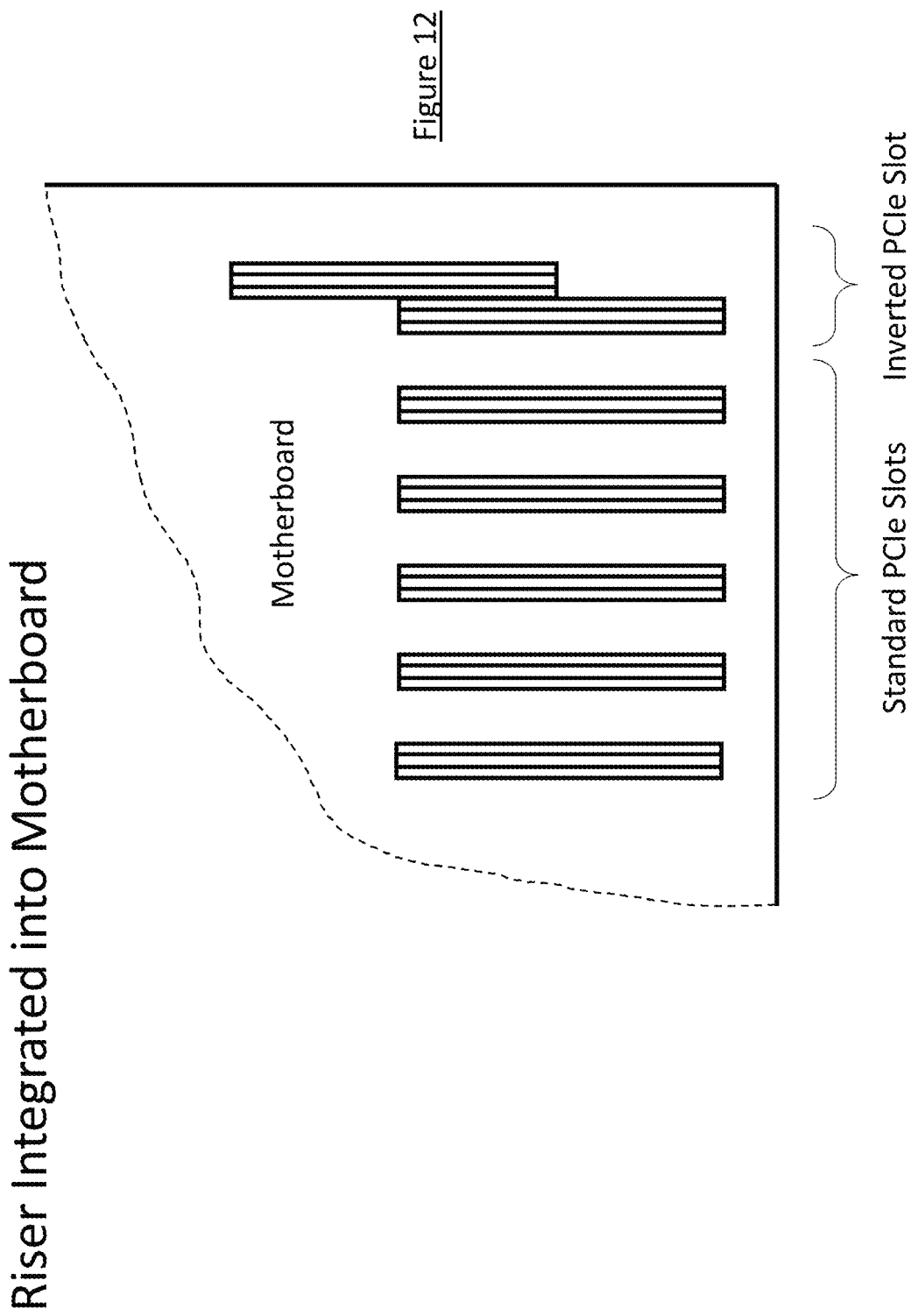

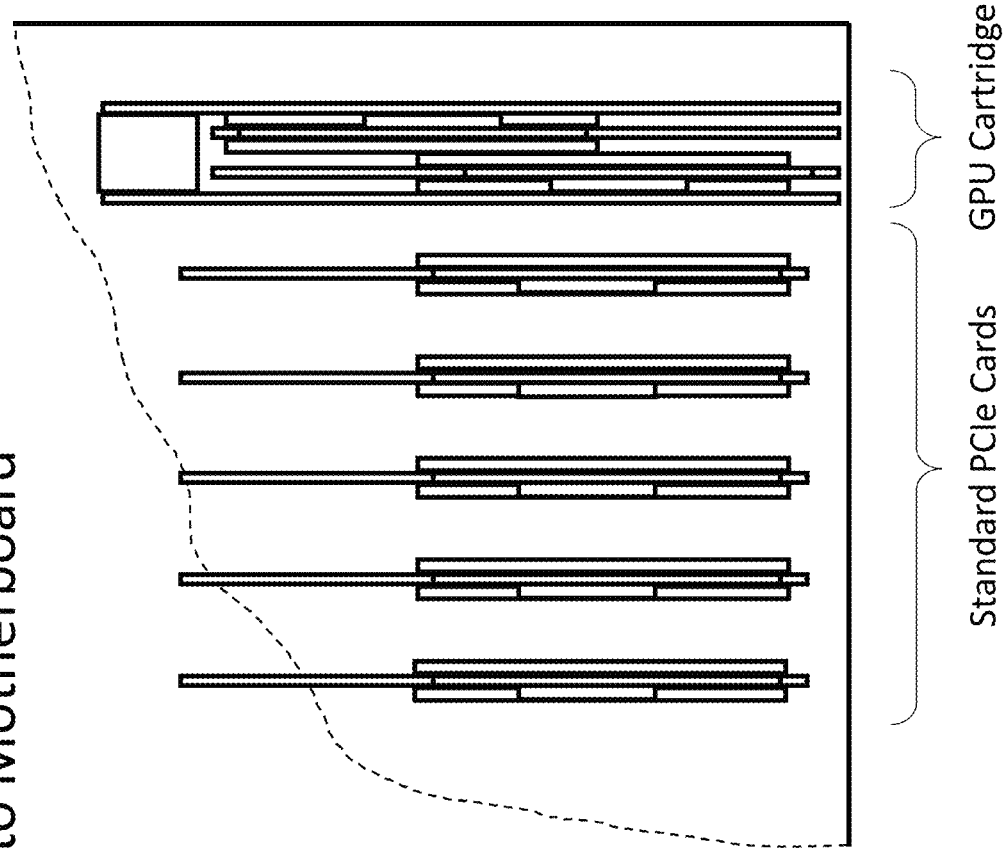

DATA PROCESSOR CARTRIDGE

CROSS REFERENCE TO RELATED APPLICATIONS

This application claims the benefit of United Kingdom Patent Application No. GB 2111982.1, filed Aug. 20, 2021, which application and any publication thereof are incorporated by reference herein.

TECHNICAL FIELD

The present invention relates generally to packaging of data processor assemblies in a cartridge.

BACKGROUND

Data processor cartridges are known, which include multiple data processor assemblies, such as GPUs. Multiple of said cartridges may be (removably) incorporated into a larger entity, which may be termed a module and comprises a tray which accommodates said cartridges. Such modules can be employed as a server. Such modules can incorporated in a server or deployed standalone connected by cables to a server (i.e. disaggregated). Single or multiple of said cartridges may be deployed directly in a server without the need to be incorporated in a module.

We have devised an improved data processor cartridge.

SUMMARY

According to the invention there is provided a data processor cartridge comprising a housing to accommodate two data processor assemblies, and further comprising:
a first connector to receive a first data processor assembly
a second connector to receive a second data processor assembly
and the second connector arranged to receive the second data processor in an inverted orientation as compared to the orientation in which the first connector receives the first data processor assembly.

The orientation of the first connector to the second connector may be said to be inverted.

The relative orientation of the first and second connectors may be such that the first data processor assembly and the second data assembly are arranged outwardly facing of one another.

The relative orientation of the first and second connectors may be such that the first data processor assembly and the second data processor assembly are arranged inwardly facing of one another.

Where each of the data processor assemblies in use comprises what is termed a hot side and a cool side, which sides are oppositely directed to one another, and the orientations of the first and second connectors may be such that the hot sides are arranged inwardly or the hot sides are arranged outwardly. The hot side may be that side of the data processor assembly on which the data processor unit is located.

At least one of the data processor assemblies may comprise a GPU assembly.

At least one of the data processor assemblies may comprise a PCIe card.

At least one of the data processor assemblies may comprise a PCIe connector.

Each data processor assembly may comprise a support structure or support member on which a data processor unit or module is mounted. The support structure may comprise a printed circuit board, or a suitable substrate.

Each of the first connector and the second connector may comprise a serial interface.

Each of the first connector and second connector may be of substantially identical type.

At least one of the connectors may comprise a slot which is arranged to receive a respective one of the data processor assemblies.

At least one of the connectors may comprise a socket provided with multiple electrical contacts.

At least one of the connectors may have an elongate form.

At least one of the connectors may comprise a PCIe card slot.

PCIe=PCI Express (Peripheral Component Interconnect Express).

Each of the first connector and the second connector comprises a respective socket.

Each of the first connector and the second connector arranged to receive a respective counterpart connector of the first data processor and the second data processor.

The first connector may be arranged substantially parallel to the second connector.

The first connector may be arranged in an offset position to the second connector.

The first connector and the second connector may be arranged adjacent to one another.

The first connector and second connector may be arranged on a riser. The riser may be termed a riser card.

The housing may define an internal space in which the first data processor and the second data processor, in use, are received. The housing may comprise an upper structure and a lower structure, and the data processor assemblies are arranged to be located in the space defined between said structures.

The cartridge may be termed a chassis.

The housing may be termed an enclosure.

The first connector and the second connector may be fast with or secured to a portion of the housing which at least in part defines the internal space.

The first connector and the second connector may be fast with or secured to a portion of the housing which provides at least some structural integrity to the cartridge.

The first connector and the second connector may be incorporated with a side wall of the housing.

Said side wall or said structure may be a detachably connectable part of the housing. Said side wall or said structure may be arranged to be secured in place by way of one or more fasteners.

The housing may comprise an integrated sub-assembly, and said sub-assembly comprises the first connector and the second connector.

The cartridge may be termed as having PCIe connectors Integrated therewith.

The data processor chassis may also comprise a heat exchanger arrangement which is arranged to be in thermal communication with the first data processor assembly and the second data processor assembly. The heat exchanger may be configured to carry heat away from the data processor assemblies. The heat exchanger may comprise a heat spreader. The heat exchanger may be arranged to carry heat to a distal end of the cartridge. The heat exchanger arrangement may comprise a conduit or container to hold liquid (such as oil or water), which can be used to carry heat away from the data processor assemblies. The heat exchanger arrangement may comprise a liquid pump.

The heat exchanger may be arranged for touching contact with the data processor assemblies.

Where the first connector and the second connector are orientated such that the first data processor assembly and the second data processor assembly are arranged inwardly, the heat exchanger is located intermediate of data processor assemblies, and in thermal communication therewith.

Where the first connector and the second connector are orientated such that the data processor assemblies are outwardly facing, the heat exchanger comprises a first portion and a second portion, each arranged outwardly of the respective data processor assembly, and in thermal communication therewith. The housing may comprise an upper structure and a lower structure, each of which includes a respective heat exchanger.

The invention may comprise one or more features disclosed in the description and/or as shown in the drawings, either individually or in combination.

BRIEF DESCRIPTION OF THE DRAWINGS

Various embodiments of the invention will now be described, by way of example only, with reference to the following drawings in which:

FIG. 1a is a schematic plan view of a GPU card and a portion of a cartridge, with the GPU card detached from the cartridge, FIG. 1b is a side view of FIG. 1a, FIG. 1c is an elevation of two card slots provided on the portion of the cartridge shown in FIG. 1a, FIG. 2a is a plan view of a GPU card and a portion of a cartridge, with the GPU card attached to the cartridge, FIG. 2b is a side view of FIG. 2a, FIG. 2c is an elevation of two card slots provided on the portion of the cartridge shown in FIG. 1a, FIG. 2d is a perspective exploded view of the components shown in FIGS. 2a, 2b and 2c.

FIG. 2e is a perspective assembled view of the components shown in FIGS. 2a, 2b and 2c.

FIG. 3a is a plan view of a card with a GPU module in place,

FIG. 3b is a side elevation of the GPU card of FIG. 3a,

FIG. 12 and FIG. 13 show a further embodiment in which PCIe slots are incorporated with a motherboard.

DETAILED DESCRIPTION

Figure 4:
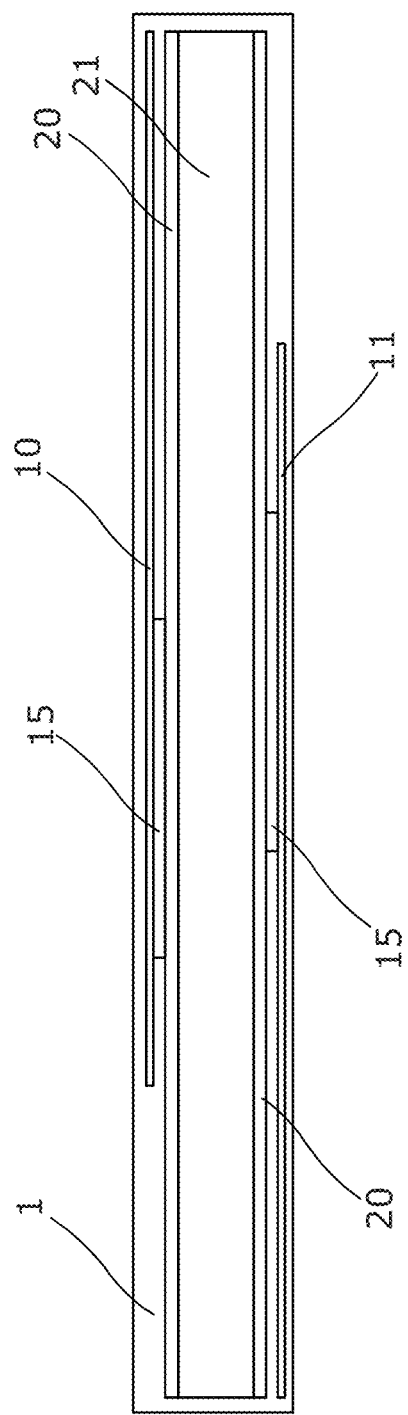
FIGS. 4 to 7 are schematic sections of different hot-to-hot configurations of cartridges.

There are now described various novel data processor cartridges, in which two data processor assemblies are provided in a novel packaging arrangement. The data cartridges described may be suitable for incorporation into a host assembly, which comprises a receiving structure arranged to carry multiple cartridges. Like reference numerals are used for similar or identical features.

In the embodiments which are now described, a cartridge comprises two connectors which are each configured to receive a respective data processor assembly. Such data processor assemblies may comprise a GPU PCIe card.

Common to all of the embodiments which are now described, is the feature of the connectors being mounted in an inverted orientation to one another. The simplified (for reasons of clarity) FIGS. 1a, 1b, 1c, 2a, 2b and 2c which are now referred to, further explain this aspect.

With reference to FIGS. 1a, 1b and 1c, there are shown schematic views of a GPU PCIe cards 10 and 11, and a portion 1 of a cartridge housing. The portion 1 of the cartridge housing is provided with two PCIe slots 2A and 2B, which are arranged to receive a respective connector portion 10a and 11a of each card 10. It will be appreciated that for ease of representation, the GPU module is not shown.

Structural components 3 may be metal or plastic brackets providing stability and rigidity to the cartridge assembly.

The slots 2A and 2B are mounted to the portion 1. The slots are arranged in parallel spaced-apart fashion, albeit said slots are offset from one another. The slots face into an internal space of the cartridge in which the cards 10 and 11 reside when connected to the slots, Additionally, the slot 2A is arranged at an inverse orientation to the slot 2B (it being noted that a connector of a card is arranged to be received in a slot in only one orientation).

Reference is now made to FIGS. 2a, 2b and 2c, which show that each of the cards 10 and 11, have been inserted into its respective slot. Communication to and from the cards 10 and 11 is achieved by a flex-circuit or PCIe cable 6, FIGS. 3a and 3b show a PCIe card on which a GPU module 15 is provided (on one side thereof).

Taking account of the above, there will now be described three embodiments in which the orientations of the slots 10 and 11 are such that the respective CPU modules face inwardly, that is towards on another. The side of each card on which the GPU module is located can be termed the hot side, and the opposite side, the cool side.

Turning to FIG. 4, there is shown a hot-hot configuration in which a heat exchanger is located intermediate of the two cards 10 and 11. The innermost facing surfaces of the GPU modules of the cards are brought into contact (or at least sufficient thermal contact) with the heat exchanger. The heat exchanger comprises two outer heat spreader layers 20, which are bonded to a heat conductive core 21.

Figure 5:
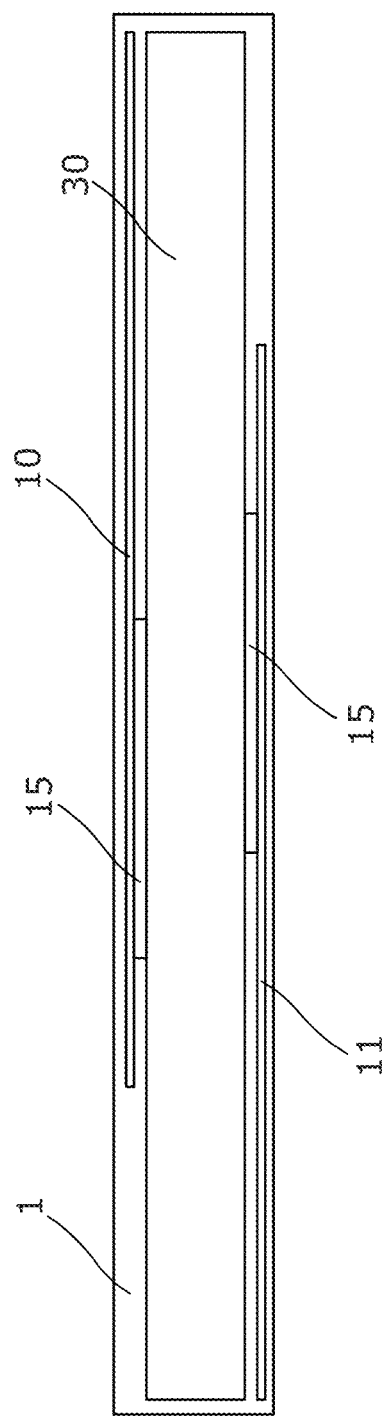

FIG. 5 shows a further embodiment which uses the hot-to-hot concept in which a heat sink 30 is located intermediate of the cards 10 and 11. The heat sink 30 is a container which includes a liquid which receives heat from the GPUs and carries away.

Figure 6:
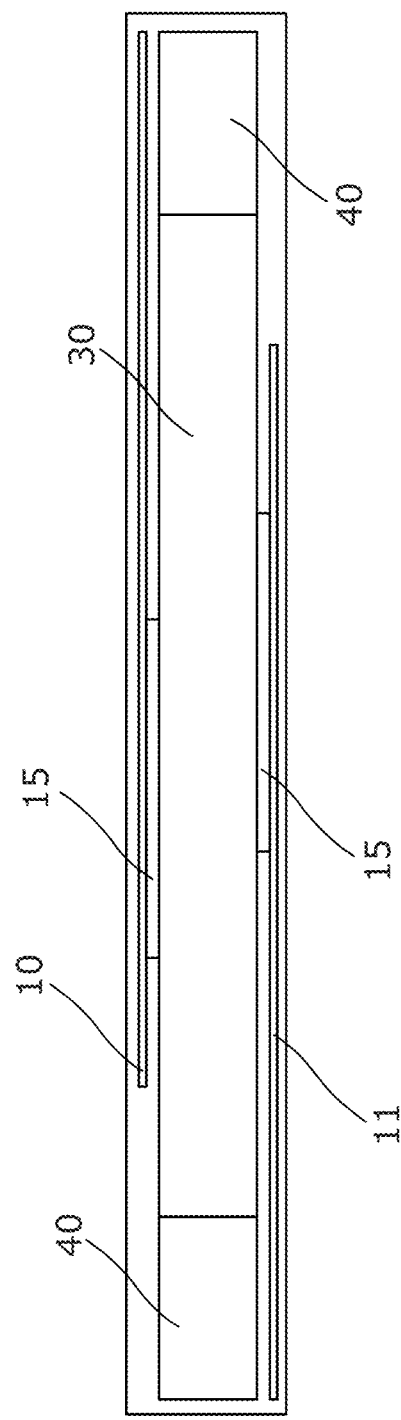

FIG. 6 shows yet a further hot-to-hot implementation in which the heat sink 30 is filled with oil and two piezo electric pumps 40 cause the fluid to carry excess heat away.

Figure 7:
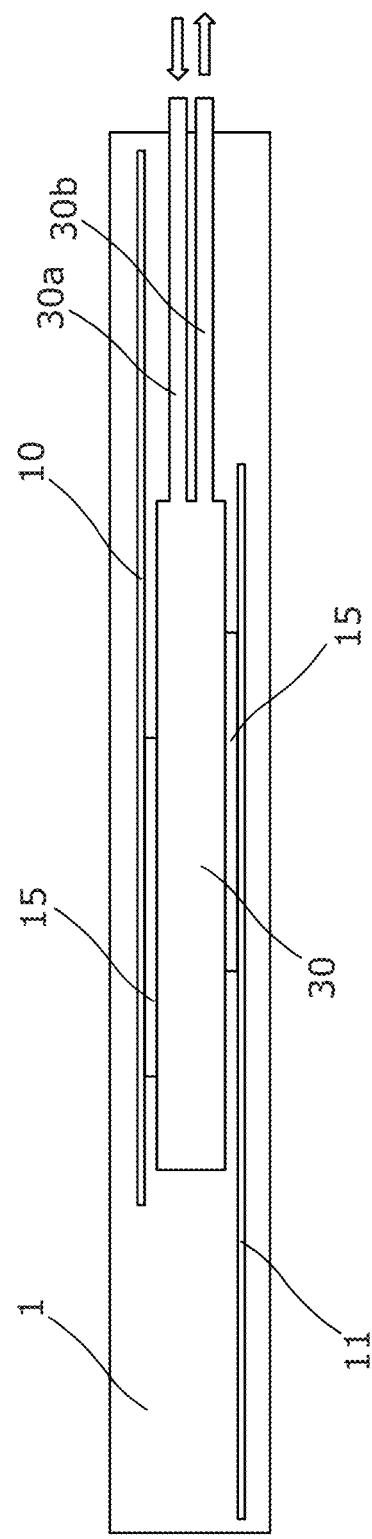

FIG. 7 shows a final example of a hot-to-hot implementation in which the heat sink comprises a water reservoir connected to an inlet conduit 30a and an outlet conduit 30b. An external pump (not shown) pumps water through the reservoir so as to carry heat away.

Figure 8:
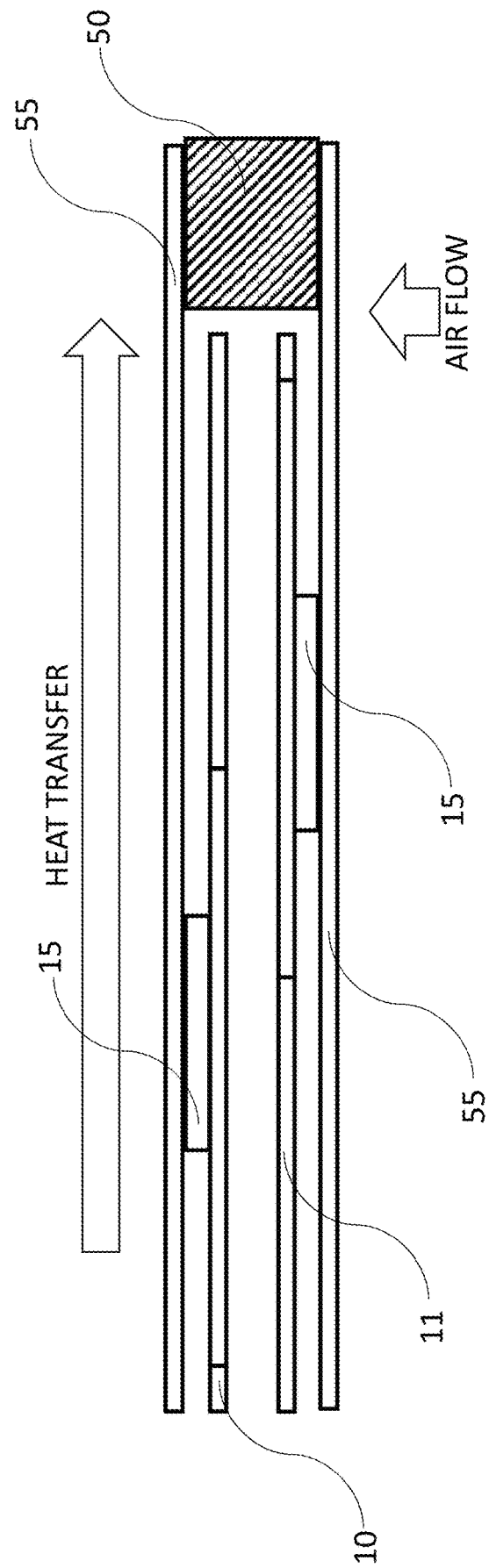
FIGS. 8 and 9 are schematic sections of two different cold-to-cold configurations of cartridges.
Figure 9:
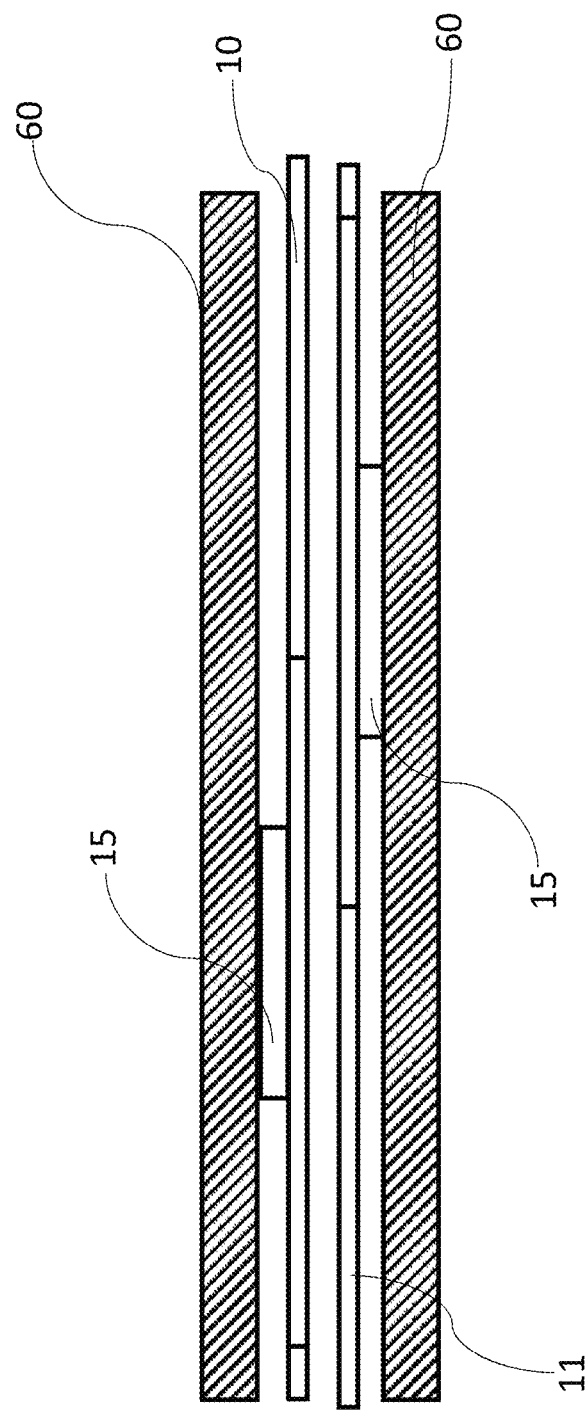

FIGS. 8 and 9 show two examples of cold-to-cold configurations, in which the GPUs are outwardly facing.

In FIG. 8a respective heat spreader 55 is held in thermal communication with each GPU. Each heat spreader is made of a highly heat conductive material. The heater spreaders are also in thermal communication with a heat exchanger 50. Air is blown towards the heat exchanger, which carries heat received form the heat spreaders. The embodiment shown in FIG. 8 may be described as air-cooled.

FIG. 9 shows an arrangement in which two oil filled heat sinks 60 are held in thermal communication with the GPUs.

Figure 10:
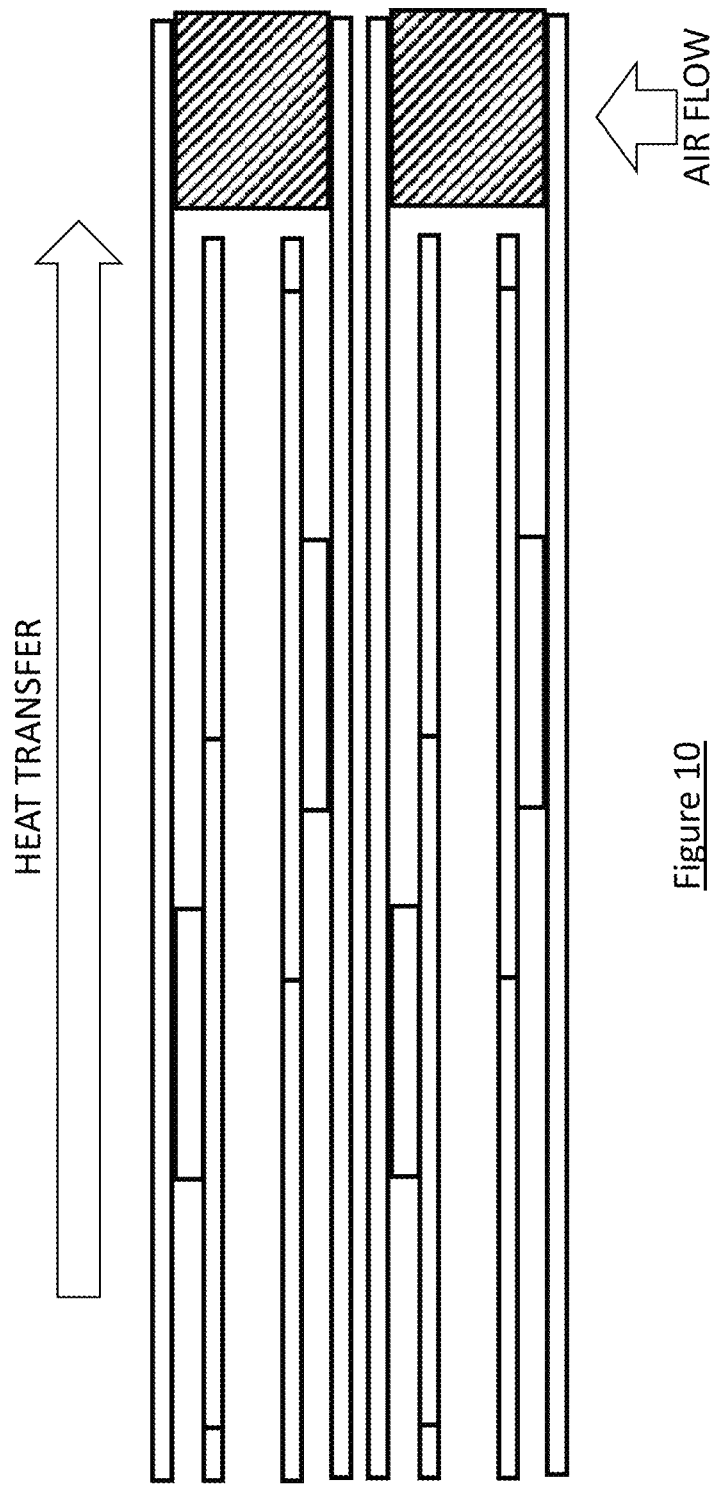
FIG. 10 shows a four-slot configuration in which is provided.

FIG. 10 shows a four card arrangement, in which is provided two pairs of inverted PCIe slots, which can be seen as a combination of two of the embodiments shown in FIG. 8, arranged in close proximity.

Figure 11:
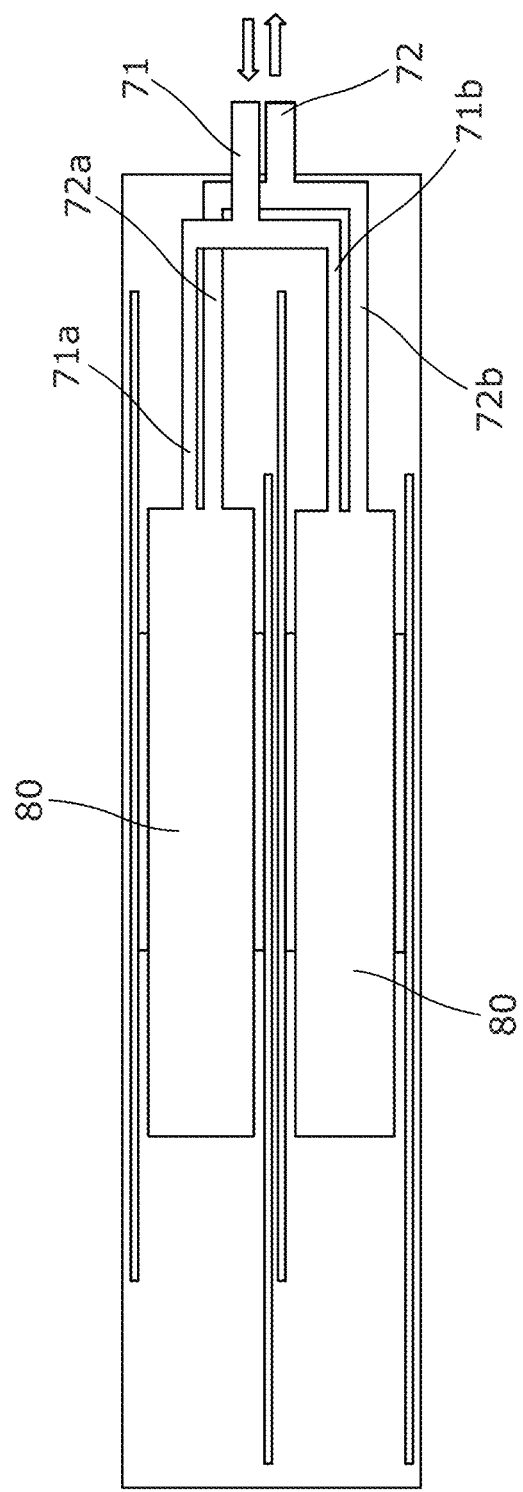
FIG. 11 shows a further four slot configuration a shared direct liquid cooling.

FIG. 11 shows a further four card arrangement which comprises a shared direct liquid cooling arrangement. In this, a respective heat exchanger container/vessel 80 is provided for each inverted pair of cards. Each exchanger is provided with an inlet and an outlet. Each inlet is connected to a cold liquid supply and each outlet allows heated liquid to exit the container. The inlet and outlet branches are referenced by 71*a*, 72*a*, and 71*b*, 72*b*, respectively. Each of the hot branches is connected to a common outlet 72, and a common inlet 71 feeds cold liquid to the two cold inlet branches.

In the above embodiments, the user of a riser (card) is disclosed which supports the inverted Me slots. As is known, risers are connectable into a motherboard via an edge connector. In alternative embodiments, the concept of inverted PCIe slots remains, but the slots are directly attached to the motherboard, or incorporate a riser into a motherboard, where the space allows. Reference is made to FIGS. 12 and 13 show an example of this, both with the cards inserted into the slots, and showing the slots themselves. As can be seen, two of the slots are arranged in an inverted configuration.

The invention claimed is:

1. A data processor cartridge comprising a housing to accommodate two data processor assemblies, each data processor assembly comprising a support structure, including a substrate, and a data processor unit mounted on a side of a respective substrate, the cartridge further comprising:
   a first connector to receive a first data processor assembly;
   a second connector to receive a second data processor assembly; and
   a heat exchanger arrangement which is configured to be commonly shared in thermal communication with the data processor units to carry heat away therefrom;
   wherein the second connector is arranged to receive the second data processor assembly in an inverted orientation as compared to the orientation in which the first connector receives the first data processor assembly, and in the inverted orientation the respective data processor units face inwardly and towards each other; and
   wherein the heat exchanger arrangement is located in an internal space between the first and second processor assemblies.

2. The data processor cartridge of claim 1, wherein the relative orientation of the first and second connectors may be such that the first data processor assembly and the second data processor assembly are arranged outwardly facing of one another.

3. The data processor cartridge of claim 1, wherein the relative orientation of the first and second connectors may be such that the first data processor assembly and the second data processor assembly are arranged inwardly facing of one another.

4. The data processor cartridge of claim 1, wherein each of the first connector and the second connector comprise a serial interface.

5. The data processor cartridge of claim 1, wherein at least one of the connectors comprises a socket provided with multiple electrical contacts.

6. The data processor cartridge of claim 1, wherein at least one of the connectors comprises a PCIe card slot.

7. The data processor cartridge of claim 1, wherein the first connector is arranged substantially parallel to the second connector.

8. The data processor cartridge of claim 1, wherein the first connector is arranged in an offset position to the second connector.

9. The data processor cartridge of claim 1, wherein a first data processor unit and a second data processor unit are received in the internal space.

10. The data processor cartridge of claim 1, wherein the housing comprises an upper structure and a lower structure, and the data processor assemblies are arranged to be located in the space defined between said structures.

11. The data processor cartridge of claim 1, wherein the first connector and the second connector are fast with or secured to a portion of the housing which at least in part defines the internal space in which the data processor assemblies are held.

12. The data processor cartridge of claim 1, wherein the first connector and the second connector are fast with or secured to a portion of the housing which provides at least some structural integrity to the cartridge.

13. The data processor cartridge of claim 1, wherein the first connector and the second connector are incorporated with a side wall of the housing.

14. The data processor cartridge of claim 13, wherein said side wall or said structure are detachably a connectable part of the housing.

15. The data processor cartridge of claim 1, wherein the heat exchanger arrangement is in touching contact with both data processor units.

16. A data processor cartridge comprising a housing to accommodate two data processor assemblies, each data processor assembly comprising a support structure, including a substrate, and a data processor unit mounted on a side of a respective substrate, the cartridge further comprising:
   a first connector to receive a first data processor assembly;
   a second connector to receive a second data processor assembly; and
   a heat exchanger arrangement;
   wherein the second connector is arranged to receive the second data processor assembly in an inverted orientation as compared to the orientation in which the first connector receives the first data processor assembly, and in the inverted orientation the data processor units are on respective outwardly facing surfaces of the substrates such that the data processor units face outwardly and away from each other;
   wherein the heat exchanger arrangement is arranged to be commonly shared in thermal communication with the data processor units to carry heat away therefrom.

17. The data processor cartridge of claim 16, wherein the heat exchanger arrangement includes first and second spreaders, wherein the first spreader is disposed adjacent the data processor unit on the outwardly facing surface of the first data processor assembly and the second spreader is disposed adjacent the data processor unit on the outwardly facing surface of the second data processor assembly.

18. The data processor cartridge of claim 16, wherein the heat exchanger arrangement is in touching contact with both data processor units.

* * * * *